United States Patent
Madison

(10) Patent No.: US 8,629,726 B1
(45) Date of Patent: Jan. 14, 2014

(54) HIGH-PERFORMANCE AMPLIFIER FOR TRANSDUCER ARRAY INPUT UNIT CELL

(75) Inventor: Gary M Madison, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/445,612

(22) Filed: Apr. 12, 2012

Related U.S. Application Data

(60) Provisional application No. 61/481,111, filed on Apr. 29, 2011.

(51) Int. Cl.
*H03F 3/08* (2006.01)
(52) U.S. Cl.
USPC .......................................... 330/308; 330/253
(58) Field of Classification Search
USPC .................. 330/117, 253, 301, 308
See application file for complete search history.

(56) References Cited

U.S. PATENT DOCUMENTS

| | | | | |
|---|---|---|---|---|
| 5,396,191 A * | 3/1995 | Sone | ............................ | 330/253 |
| 5,406,220 A * | 4/1995 | Jones et al. | .................... | 330/253 |
| 5,847,598 A * | 12/1998 | Sone | ............................ | 327/563 |
| 7,459,976 B2 * | 12/2008 | Zolfaghari | .................... | 330/253 |
| 2002/0070804 A1* | 6/2002 | Giduturi | ...................... | 330/253 |

* cited by examiner

*Primary Examiner* — Khanh V Nguyen
(74) *Attorney, Agent, or Firm* — Finch & Maloney PLLC; Neil F. Maloney; Daniel J. Long

(57) ABSTRACT

Circuitry is disclosed that can be used, for example, in a readout circuit of an active imaging or other sensing application. The circuitry can be configured, for instance, for increasing the gain of a differential amplifier non-inverting leg used to drive the inverting output by means of a current-source load. In some example embodiments, the circuitry is suitable for use in a focal plane array input unit cell and can be implemented, for instance, as a relatively low power amplifier with high gain, bandwidth and output current-sinking capability (in some embodiments; current sourcing in others) sufficient to respond to very fast photo-diode (e.g., standard or e-APD) detector signals. The amplifier circuitry can be used with other transducer arrays and is not intended to be limited to imaging applications.

27 Claims, 5 Drawing Sheets

US 8,629,726 B1

HIGH-PERFORMANCE AMPLIFIER FOR TRANSDUCER ARRAY INPUT UNIT CELL

RELATED APPLICATION

This application claims the benefit of U.S. Provisional Application No. 61/481,111, filed on Apr. 29, 2011, which is herein incorporated by reference in its entirety.

FIELD OF THE DISCLOSURE

The invention relates to amplifiers, and more particularly, to capacitive-feedback integrating amplifiers for transducer arrays such as focal plane arrays.

BACKGROUND

Standard single-ended or differential amplifiers can be used in a number of applications. However, they are not suitable for all applications, particularly with respect to applications that place more stringent demands on performance criteria such as speed and power consumption. In short, there are a number of non-trivial issues associated overcoming such limitations.

SUMMARY

One embodiment of the present invention provides an amplifier device. The device includes a differential transistor pair for receiving a differential input signal, wherein a first transistor of the differential pair provides a non-inverting input of the amplifier device and a second transistor of the differential pair provides an inverting input of the amplifier device. The device further includes an amplification stage operatively coupled to the differential transistor pair. The amplification stage includes a third transistor serially connected with the first transistor of the differential pair, and a fourth transistor serially connected with the second transistor of the differential pair, wherein the third transistor is configured to receive a bias voltage on its input and acts as a current source. In some cases, voltage drop across the third transistor in response to an input voltage difference between the non-inverting and inverting inputs provides a first stage of gain. In some such cases, voltage output from the third transistor is fed to the input of the fourth transistor which provides a second stage of gain. In some cases, the device further includes a resistive-capacitive compensation network operatively coupled across the third transistor and to an input of the fourth transistor, wherein the compensation circuit includes a resistor serially connected to a capacitor. In some cases, the device further includes a resistive-capacitive compensation network operatively coupled across the third transistor and to an input of the fourth transistor, wherein the compensation circuit includes a fifth transistor serially connected to a capacitor, and the fifth transistor is configured to receive a bias voltage on its input so as to function as a resistor. In some cases, the device includes a current source that sets an operating current of the amplifier. In some cases, the device includes an integration capacitor operatively coupled between an output of the amplifier and the inverting input. In some cases, the device includes a reset switch operatively coupled between an output of the amplifier and the inverting input. In one such case, the non-inverting input is configured to receive a bias voltage that sets a reset voltage that will be presented at the amplifier output during a reset interval. Numerous variations will be apparent. For instance, another example embodiment provides a read-out integrated circuit (ROIC) comprising the amplifier device as variously defined in this paragraph. Another embodiment provides a sensor system that includes the ROIC, wherein the system includes a transducer array operatively coupled to the ROIC by an interconnect. Another example embodiment provides a system-on-chip comprising the sensor system.

Another embodiment of the present invention provides an amplifier device. In this example case, the device includes a differential transistor pair for receiving a differential input signal, wherein a first transistor of the differential pair provides a non-inverting input of the amplifier device and a second transistor of the differential pair provides an inverting input of the amplifier device. The device further includes an amplification stage operatively coupled to the differential transistor pair. The amplification stage includes a third transistor serially connected with the first transistor of the differential pair, and a fourth transistor serially connected with the second transistor of the differential pair, wherein the third transistor is configured to receive a bias voltage on its input and acts as a current source. The device further includes a resistive-capacitive compensation network operatively coupled across the third transistor and to an input of the fourth transistor. The device further includes a current source that sets an operating current of the amplifier. In some cases, voltage drop across the third transistor in response to an input voltage difference between the non-inverting and inverting inputs provides a first stage of gain, and voltage output from the third transistor is fed to the input of the fourth transistor which provides a second stage of gain. In some cases, the compensation circuit includes a resistor serially connected to a capacitor. In some cases, the compensation circuit includes a fifth transistor serially connected to a capacitor, and the fifth transistor is configured to receive a bias voltage on its input so as to function as a resistor. In some cases, the device includes an integration capacitor operatively coupled between an output of the amplifier and the inverting input, and a reset switch coupled across the integration capacitor, wherein the non-inverting input is configured to receive a bias voltage that sets a reset voltage that will be presented at the amplifier output during a reset interval. Another embodiment provides a system-on-chip that includes a ROIC configured with a plurality of the amplifier device as variously defined in this paragraph, and a transducer array operatively coupled to the ROIC by an interconnect.

Another embodiment of the present invention provides a sensing system. The system includes a transducer array and a ROIC operatively coupled to the transducer array by an interconnect. The ROIC includes a differential transistor pair for receiving a differential input signal, wherein a first transistor of the differential pair provides a non-inverting input of the amplifier device and a second transistor of the differential pair provides an inverting input of the amplifier device. The ROIC further includes an amplification stage operatively coupled to the differential transistor pair. The amplification stage includes a third transistor serially connected with the first transistor of the differential pair, and a fourth transistor serially connected with the second transistor of the differential pair, wherein the third transistor is configured to receive a bias voltage on its input and acts as a current source. The ROIC further includes a resistive-capacitive compensation network operatively coupled across the third transistor and to an input of the fourth transistor. The ROIC further includes a current source that sets an operating current of the amplifier. The ROIC further includes an integration capacitor operatively coupled between an output of the amplifier and the inverting input, and a reset switch coupled across the integration capacitor, wherein the non-inverting input is configured to receive a bias voltage that sets a reset voltage that will be presented at the amplifier output during a reset interval. Voltage drop across the third transistor in response to an input voltage difference between the non-inverting and inverting inputs provides a first stage of gain, and voltage output from the third transistor is fed to the input of the fourth transistor which provides a second stage of gain. In some cases, the transducer array is for sensing radiation. As will be appreciated in light of this disclosure, the ROIC may include a plurality of amplifier circuits as variously defined in this paragraph.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Circuitry is disclosed that can be used, for example, in a readout circuit of an active imaging or other sensing application. In some such embodiments, for instance, the circuitry is suitable for use in a focal plane array (FPA) input cell and can be implemented as a relatively low power amplifier with high gain, bandwidth and output current-sinking (in some embodiments; current sourcing in others) capability sufficient to respond to very fast photo-diode (e.g., standard or e-APD) detector signals. The amplifier circuitry can be used with other transducer arrays and is not intended to be limited to imaging applications.

General Overview

As previously explained, single-ended or differential amplifiers can be used in a number of applications. However, they are not suitable for all applications, particularly with respect to applications that place more stringent demands on performance criteria such as speed and power consumption. For instance, a standard single-ended or differential amplifier can, in general, be used for focal plane array (FPA) input unit cells to improve performance with negative feedback. However, the transconductance of the amplifier is limited to that of its input devices, which places an upper bound on the bandwidth into a capacitive load, and a lower bound on its summing junction impedance and consequent ability to minimize sensor voltage changes with changing photocurrents. In addition, such a standard amplifier is incapable of sourcing or sinking any more current than its supply current, even if overdriven, which strictly limits its slew-rate. And its load devices, implemented with a unity-gain current mirror, entail a size compromise between speed and noise. For instance, if the size of the load devices is increased for improved noise performance of the amplifier, the resulting capacitance increase will compromise speed of the amplifier.

For these reasons, conventional charge-integration differential amplifiers, unless supplied with considerably more power, are generally inadequate for applications requiring very short (e.g., <1 µS) integration times. Such limitations preclude the use of standard differential amplifier configurations, for example, when thousands of input amplifiers are needed for readout of large 2-dimensional focal plane arrays (FPAs) with small pitch in active imaging applications that require fast response. For instance, consider the example case of a 50 by 50 or larger pixel array that requires 2500 or more amplifiers to readout each pixel of the array. As will be appreciated, the size of the FPA can vary from application to application, and much larger array sizes can be implemented (e.g., 1024 by 1024, 256 by 512, etc).

Figure 1:
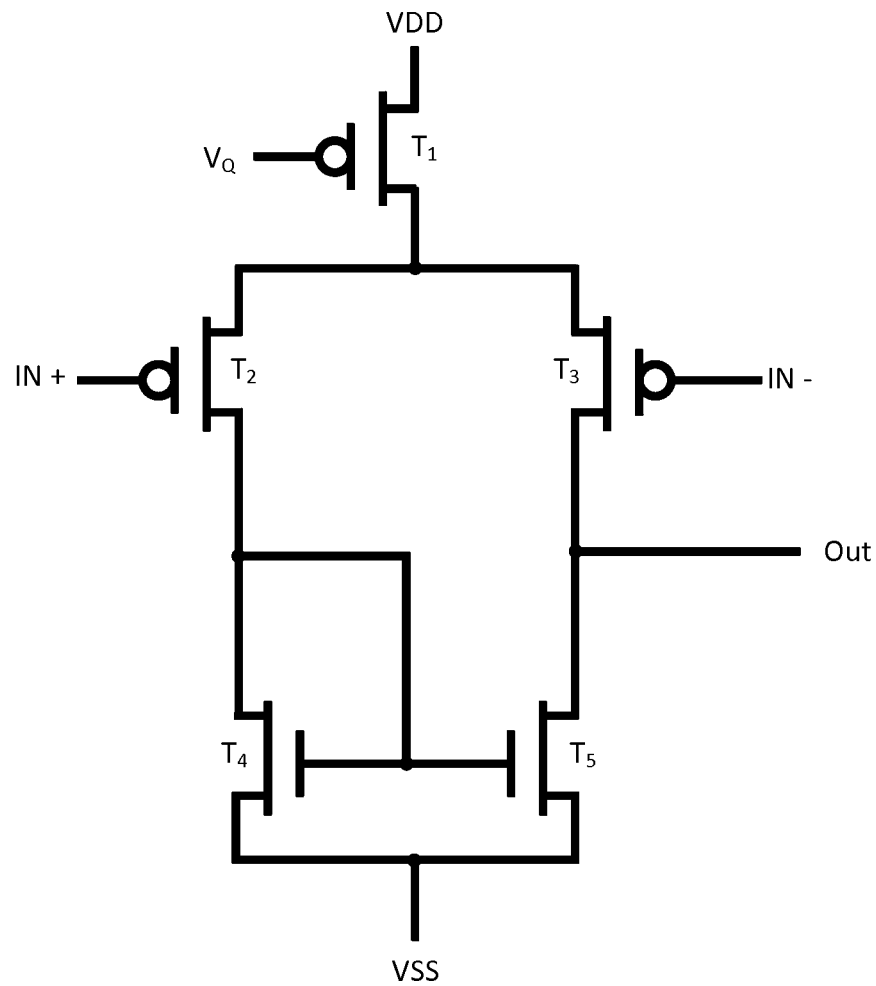
FIG. 1 is a schematic of a general differential amplifier.

FIG. 1 is a schematic of a general differential amplifier that might be suitable for use in FPA input cells. As can be seen, the amplifier includes five transistors ($T_1$-$T_5$) and is operatively coupled between power supplies VDD and VSS. The differential pair of transistors $T_2$ and $T_3$ receives the differential input signal (IN +, IN −). In addition, transistors $T_4$ and $T_5$ operate as the load devices of the amplifier and are connected as a master-slave current-source pair to ensure that both legs have the same current. The non-inverting leg of the differential amplifier includes $T_2$ and $T_4$, and the inverting leg includes $T_3$ and $T_5$. As will be appreciated, note that the situation where the current-source pair ensures that both legs have the same current only applies when no external current is drawn from the amplifier output, such as under quiescent conditions with no DC load externally connected to the amplifier output. On the other hand, when output current is drawn, the current source pair maintains equal currents in transistors $T_4$ and $T_5$, but the current in transistor $T_3$ will be different. Transistor $T_1$ operates as a current source during normal operation, and sets the amplifier operating current or quiescent point based on the value of $V_Q$, which can be set as desired for a given application, as can the value of the power supplies VDD and VSS. In an active imaging application, such a differential amplifier configuration as shown in FIG. 1 may be too slow and/or consume too much power when used in conjunction with very short integration times (e.g., such as those <1 us). In addition, the current-sourcing and current-sinking capability of the amplifier is limited by its operating current, as set by $T_1$ and $V_Q$.

Thus, and in accordance with an embodiment of the present invention, the load transistor $T_4$ is effectively reconfigured into a current source, thereby increasing the gain of the differential amplifier non-inverting leg used to drive transistor $T_5$, which drives the amplifier output. This very efficiently creates, in effect, an additional stage of gain, which can be configured with an optional compensation circuit, in accordance with various embodiments of the present invention. As will be further appreciated in light of this disclosure, the effect on amplifier performance by such a reconfiguration as provided herein is significant.

For instance, with the same process and operating current, significantly greater gain, bandwidth, and slew rate (relative to that of the differential amplifier shown in FIG. 1) can be realized. Note that this improvement can be accomplished without the need for a cascode device for driving the amplifier output. In addition, in one example embodiment of the present invention, the reconfiguration provides an output current-sinking capability that is orders of magnitude greater than the amplifier operating current. In other example embodiments, note that the reconfiguration may be used to provide an output current-sourcing capability that is orders of magnitude greater than the amplifier operating current, as will be appreciated in light of this disclosure. Furthermore, the noise contribution of the transistor devices that drive the amplifier output (e.g., $T_5$ in various embodiments) is minimized, permitting the use of very small transistor devices with consequent reduced input and feedback capacitances. These properties enable the amplifier to respond, for example, to very fast photo-sensor signals and integrate with much smaller feedback capacitors, while significantly reducing sensor voltage changes with varying photocurrents, in accordance with some example embodiments of the present invention.

Numerous variations will be apparent in light of this disclosure. For instance, any suitable transistor technology can be used to implement the amplifier. For instance, p-channel and/or n-channel field effect transistors (FETs) or NPN and/or PNP bipolar junction transistors (BJTs) or a combination thereof can be used to implement the transistors of the amplifier. Moreover, the amplifier can be used in any number of applications, whether imaging or biometric or other sensor-based application that requires a transducer for detecting an event and generating an electrical signal therefrom so that signal can be readout and processed as desired.

Amplifier Circuit

Figure 2A:
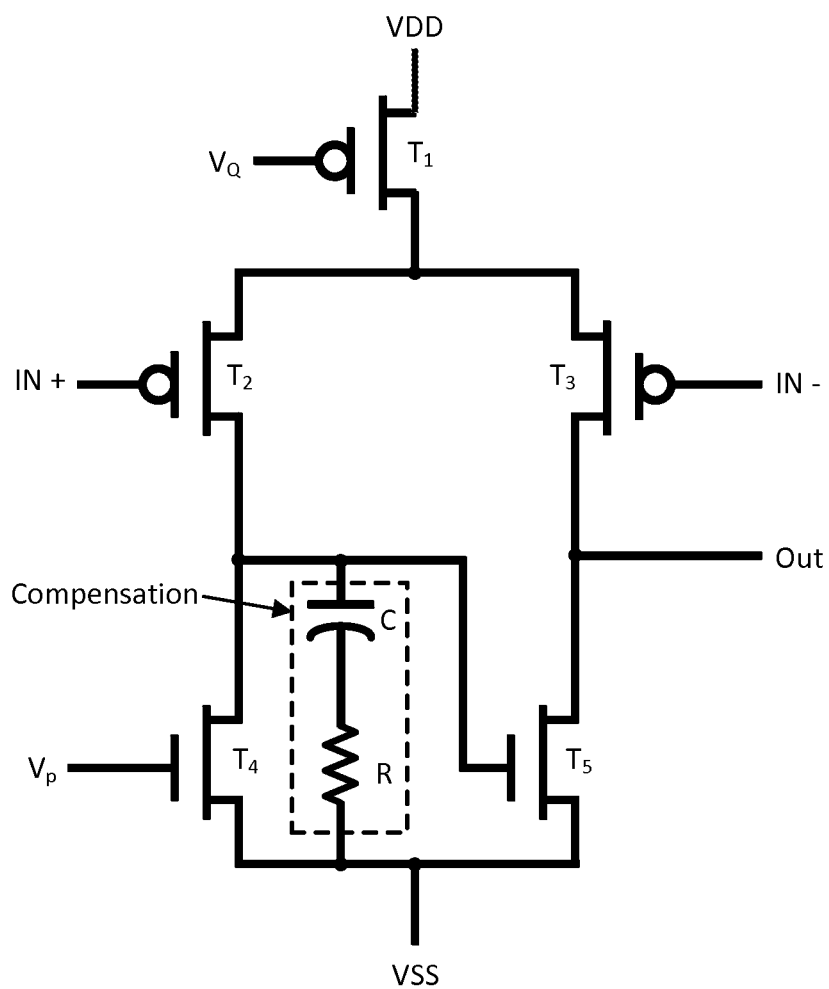
FIG. 2a is a schematic of an amplifier circuit configured in accordance with an embodiment of the present invention.

FIG. 2a is a schematic of an amplifier circuit configured in accordance with an embodiment of the present invention. As can be seen, the amplifier includes five transistors ($T_1$-$T_5$) and is operatively coupled between power supplies VDD and VSS. Transistor $T_1$ operates as a current source during normal operation, and sets the amplifier operating current or quiescent point based on the value of $V_Q$, which can be set as desired for a given application, as can the value of the power supplies VDD and VSS. The differential pair of transistors $T_2$ and $T_3$ receives the differential input signal (IN +, IN −). In addition, transistors $T_4$ and $T_5$ operate as the load devices of the amplifier. The non-inverting leg of the differential amplifier includes $T_2$ and $T_4$, and the inverting leg includes $T_3$ and $T_5$.

In addition, and in accordance with an embodiment of the present invention, the load transistor $T_4$ is effectively reconfigured into a current source by applying a bias to its gate, and in some such cases, a compensation circuit can be added across load transistor $T_4$. The addition of this current source has the effect of increasing the gain of the differential amplifier non-inverting leg used to drive transistor $T_5$, which drives the amplifier output. As previously explained, the addition of this $T_4$-based current source creates, in effect, an additional stage of gain. In this example embodiment, the optional compensation circuit is implemented with a resistor R and capacitor C serially connected across the drain and source of transistor $T_4$.

In this example configuration, complementary metal oxide semiconductor (CMOS) technology is employed, in that the transistors $T_2$ and $T_3$ are implemented with p-channel field effect transistors (FETs), and the load transistors $T_4$ and $T_5$ are implemented with n-channel FETs. Other embodiments may employ, for example, use of n-channel FETs for transistors $T_2$ and $T_3$, with p-channel FETs for load transistors $T_4$ and $T_5$. In such a case, note that VDD and VSS is reversed as well, and transistor $T_1$ would be an n-Channel FET (to be compatible with transistors $T_2$ and $T_3$). In other embodiments, transistors $T_2$ and $T_3$ may be implemented with PNP BJTs, and load transistors $T_4$ and $T_5$ may be implemented with NPN BJT load transistors. In still other embodiments, transistors $T_2$ and $T_3$ may be implemented with NPN BJTs, and load transistors $T_4$ and $T_5$ may be implemented with PNP BJT load transistors (again, in this latter case, VDD and VSS would be reversed as well; in addition transistor $T_1$ can be selected to be compatible with transistors $T_2$ and $T_3$). Numerous variations will be apparent in light of this disclosure, and the claimed invention is not intended to be limited to any particular transistor technology. As will be appreciated, transistors $T_3$ and $T_5$ effectively drive the amplifier output, and transistors $T_2$ and $T_4$ effectively drive transistor $T_5$.

The bias signal $V_p$ supplied to the gate of transistor $T_4$ effectively turns transistor $T_4$ into a current source and sets the nominal current through transistor $T_4$. In one example embodiment shown, the bias signal $V_p$ is a DC voltage. The value of $V_p$ can be set as desired. In one example embodiment, for instance, $V_p$ is set so that the nominal current through transistor $T_4$ is about one-half the current through $T_1$. As will be appreciated, the values of resistor R and capacitor C of the compensation circuit generally depend, for instance, upon the specific characteristics of the transistor devices ($T_2$ through $T_5$) used and their operating conditions.

Figure 2B:
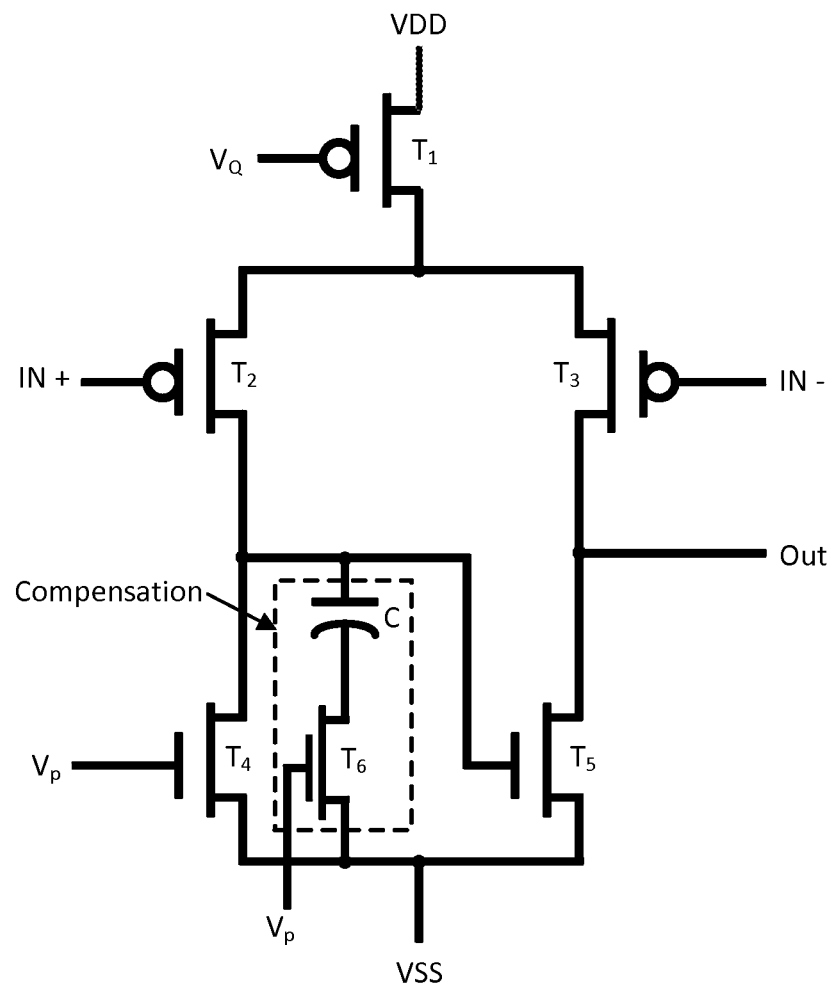
FIG. 2b is a schematic of an amplifier circuit configured in accordance with another embodiment of the present invention.

In another embodiment of the present invention, the optional compensation network can be implemented as shown in FIG. 2b, where the resistor R has been replaced with a transistor $T_6$ (which is implemented with an n-channel FET in this example case). As will be appreciated, a FET with a DC voltage above threshold applied to its gate will generally act like a resistor if there is no DC voltage between the source and drain. As the drain-to-source voltage is increased, it increasingly begins to act like a current source. Thus, in the context of this example embodiment, the source and drain of transistor $T_6$ effectively act as resistor terminals, and the gate of transistor $T_6$ is connected to a DC bias voltage, such as $V_p$, or other suitable bias signal.

In one specific example embodiment, assuming an operating current provided by $T_1$ in the range of 1 to 5 microamps (e.g., 2 µA), the capacitor C of the optional compensation network can be in the range, for instance, of 20 to 200 femtofarads (e.g., 100 ff), and the resistive portion of the compensation network can be implemented with, for example, a FET having a gate length in the range of 1 to 10 microns and a width of about 1 micron. Other embodiments may employ a thin film resistor for the resistive portion of the compensation network (e.g., 10 k to 100 kΩ, such as 50 kΩ). As will be appreciated, numerous specific configurations can be implemented depending on the particulars of the given application, and the claimed invention is not intended to be limited to any particular operating parameters or component types/values.

Unit Cell Pre-Amplifier for Sensor Array

Figure 3A:
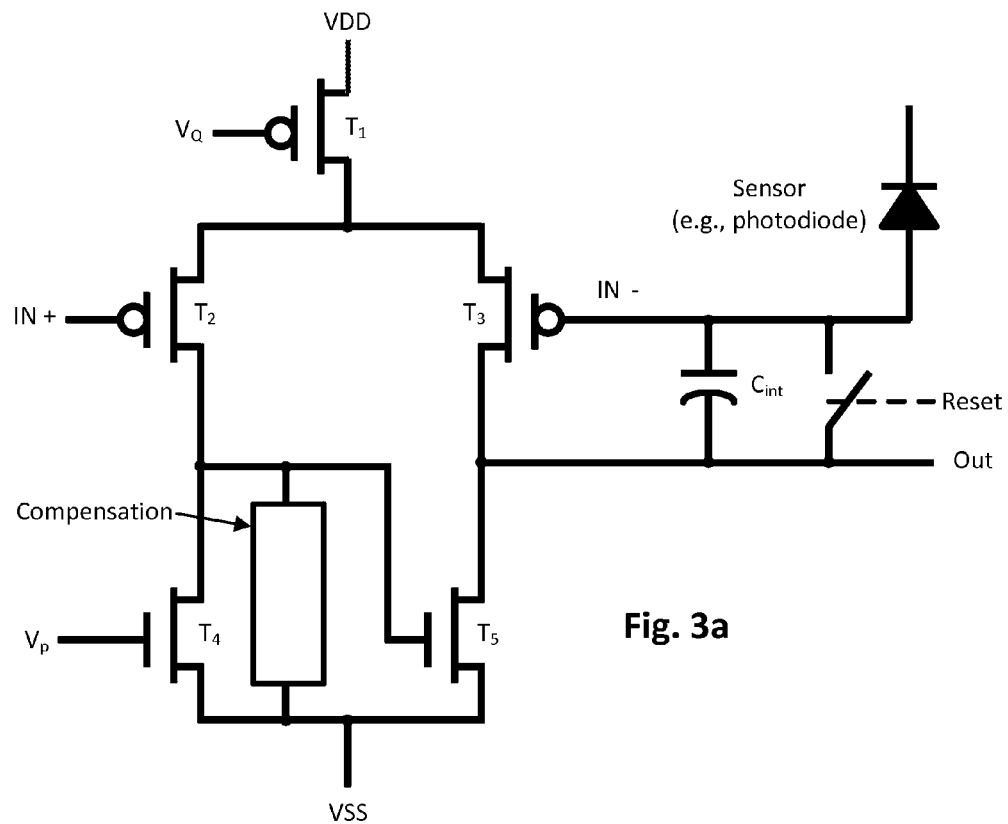
FIGS. 3a-3b each depicts how the amplifiers of FIGS. 2a-b can be used in a transducer array input unit cell, in accordance with an embodiment of the present invention.
Figure 3B:
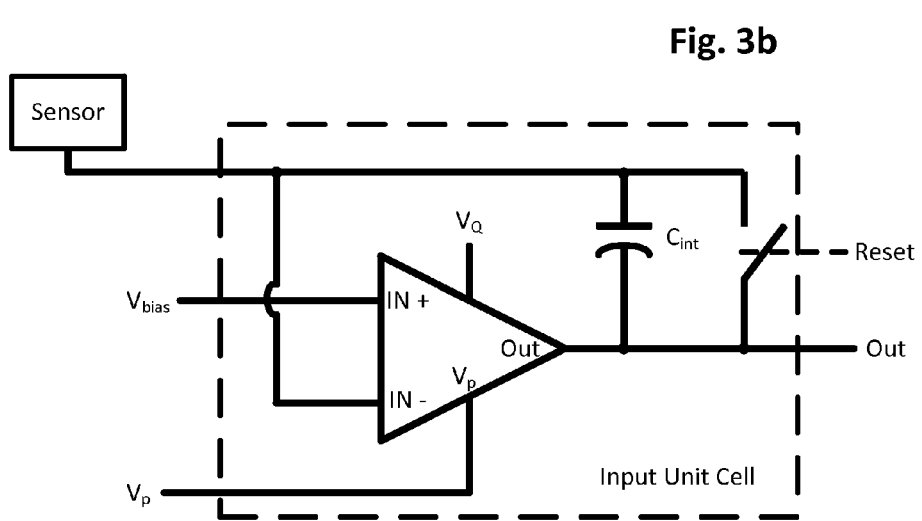

FIGS. 3a-3b each depicts how the amplifiers of FIGS. 2a-b can be used in a FPA input unit cell, in accordance with an embodiment of the present invention. As shown in FIG. 3a, the sensor array can be implemented with an array of photodiodes or quantum photovoltaic detectors for imaging applications, although other sensor technology can be used, depending on the given application. For instance, for a biometric application such as a fingerprint recognition system, the sensor may be a piezoelectric device that converts physical contact into an electrical signal. Numerous other transducer types can be used to implement the sensor for each pixel of the array. The optional compensation circuit can be implemented, for instance, as a resistor-capacitor or a transistor capacitor circuit, as previously described.

FIG. 3b shows the circuit configured as capacitor transimpedance integration amplifier (CTIA), where the operational amplifier can be configured as shown in FIG. 3a. Assuming the sensor is, for example, a photodiode or quantum photovoltaic detector, the CTIA can be used in photodetector applications. Just as previously explained, other transducers can be used for other applications.

As can be further seen in FIGS. 3a-b, the amplifier circuit is configured as a capacitive-feedback integrating amplifier, by virtue of capacitor $C_{int}$ connected from the amplifier output to the inverting input IN−. The operating conditions for the amplifier are set when the output is momentarily shorted to the inverting input IN− when the Reset switch is closed. A bias signal $V_{bias}$ provided on the non-inverting input IN+ can be used to set the reset voltage that will be presented at the amplifier output during the reset interval. During the reset interval (assuming no external DC load), both devices $T_2$ and $T_3$ of the differential pair will be operating at the same current, in accordance with one example embodiment. The negative feedback of the CTIA after the reset operation maintains this condition, keeping the differential pair $T_2$ and $T_3$ balanced, and effectively stabilizes sensor bias. The capacitor $C_{int}$ in the feedback path of the amplifier integrates charge received from the sensor.

Sensing System

Figure 4:
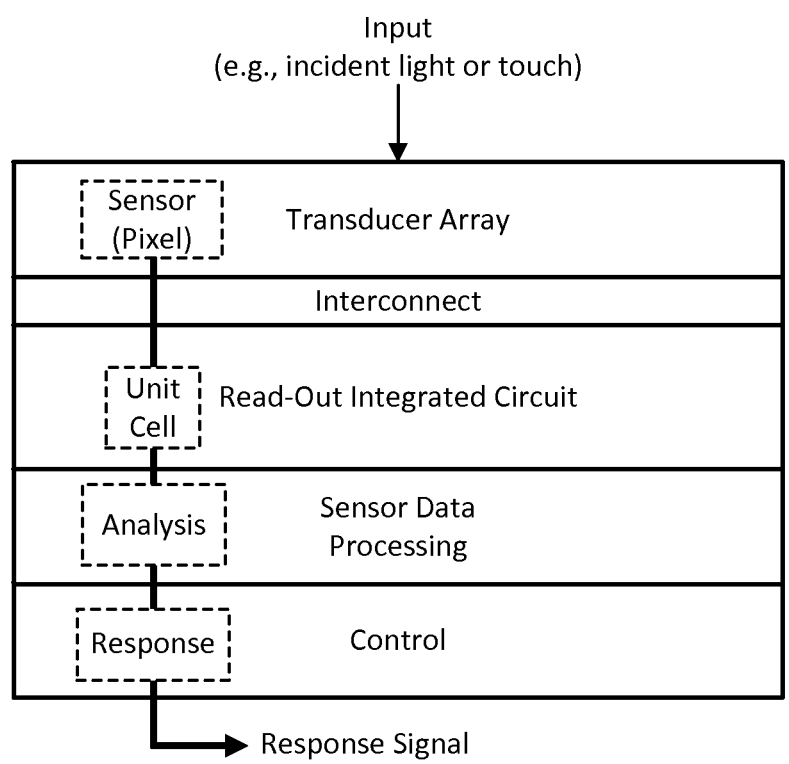
FIG. 4 illustrates a sensing system configured in accordance with an embodiment of the present invention.

FIG. 4 illustrates a sensing system configured in accordance with an embodiment of the present invention. As can be seen, the system generally includes a transducer array operatively coupled to a read-out integrated circuit (ROIC) via an interconnect. The ROIC is in turn operatively coupled to a sensor data processing block, which is connected to a control circuit. Each of the transducer array, interconnect, ROIC sensor data processing block and control circuit can be implemented with conventional or custom technology. In addition, the ROIC can further be configured to include, for example, unit cell pre-amplifier circuits each configured with an amplifier as described herein, such as shown in FIGS. 2a-b.

In some embodiments where the transducer array is, for example, a CMOS FPA suitable for imaging applications, the array can be integrated with the ROIC via flip-chip hybridization using, for instance, indium bump bonding or other suitable interconnect process. In another embodiment, the transducer array can be implemented as a CMOS piezoelectric (for cell force sensing) or capacitive (cell touch sensing) sensor array suitable for biometric or security applications, such as a fingerprint detection. Just as with imaging applications, each pixel sensor element can be electrically connected to its own integration unit cell circuitry in the ROIC. As will be appreciated, the pixel resolution of imaging applications may be much higher than the pixel resolution of biometric application, but the principles provided herein equally apply to any such applications, as will be appreciated in light of this disclosure.

As previously explained, each unit cell can include a pre-amplifier circuit configured as shown, for instance, in FIG. 2a or 2b. The unit cell may include other circuitry as well, such as filtering if so desired. The ROIC may further include row and column select circuitry, column sense amplifiers, multiplexor circuitry, and other typical ROIC circuitry. In one specific such embodiment, the transducer array is bump-bonded or otherwise integrally coupled with the ROIC so as to provide a system-on-chip which can be operatively coupled to the sensor data processing block. In still other embodiments, the sensor data processing block and control blocks can be integrated with the ROIC circuitry, in another system-on-chip configuration.

As will be appreciated, the analysis carried out by the sensor data processing block will depend on the given application and type of sensor technology employed in the transducer array. For instance, in imaging applications, the sensor data processing block may be configured to identify certain features or events reflected in the imaging data and/or otherwise interpret the image data so that the control block can be directed accordingly. For biometric applications, the sensor data processing block may be configured to identify certain biometric features or events (e.g., fingerprint, eye-scan, touch, etc) reflected in the biometric data. In a more general sense, regardless of the given application, the sensor data processing block can be configured to carryout feature/event identification using the data received from the transducer array. Once features/events have been extracted from that sensor data, they can be, for instance, compared to one or more templates stored in the database and assigned a matching score. The sensor data processing block may further be configured, for example, to execute a determination as to a response strategy, based on a given matching score. For instance, in an imaging application involving electronic countermeasures, the image data may reflect the type of incoming threat (e.g., missile), and the response strategy may include a particular evasive maneuver and/or electronic counter-measure to which that incoming threat is known to be susceptible (e.g., chaff deployment and/or jamming). In biometric applications such as fingerprint verification, the biometric data may reflect the various fingerprint details reflected in the tactile pressure applied at the sensor face, and the response strategy may include a providing (or denying) access to a given secured area. As will be appreciated, the analysis carried out by the sensor data processing block can include any number of determinations necessary to effectively direct the control block accordingly.

Based on the assessment of the sensor data processing block, a response can then be provided by the control block, which will also depend on the given application. For instance, in an imaging application involving electronic countermeasures, the control block may electronically command the particular evasive maneuver and/or electronic counter-measure to which that incoming threat is known to be susceptible (e.g., chaff deployment and/or jamming). In biometric applications such as fingerprint verification, the control block may issue the control signal needed to open a door that provides access to the secured area. Numerous sensor data processing/analysis and control/response schemes can be used here, as will be appreciated in light of this disclosure, and the claimed invention is not intended to be limited to any particular ones.

The foregoing description of the embodiments of the invention has been presented for the purposes of illustration and description. It is not intended to be exhaustive or to limit the invention to the precise form disclosed. Many modifications and variations are possible in light of this disclosure. For example, the various example embodiments provided herein show configurations where a transistor in the amplification stage (e.g., transistor $T_4$) is effectively converted to a current source, by applying a bias to its gate/base. In other embodiments, note that this added current source can be implemented with other circuitry suitable for providing the desired current source, ranging from a resistor to more involved transistor or op-amp based current source circuitry. Regardless of the implementation, a similar function as described herein can be achieved. It is intended that the scope of the invention be limited not by this detailed description, but rather by the claims appended hereto.

What is claimed is:

1. An amplifier device, comprising:
   a differential transistor pair for receiving a differential input signal, wherein a first transistor of the differential pair provides a non-inverting input of the amplifier device and a second transistor of the differential pair provides an inverting input of the amplifier device;
   an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input, and acts as a current source; and a resistive-capacitive compensation network operatively coupled across the third transistor and to an input of the fourth transistor, wherein the compensation network includes a resistor serially connected to a capacitor.

2. The amplifier device of claim 1 wherein voltage drop across the third transistor in response to an input voltage difference between the non-inverting and inverting inputs provides a first stage of gain.

3. The amplifier device of claim 2 wherein voltage output from the third transistor is fed to the input of the fourth transistor which provides a second stage of gain.

4. The amplifier device of claim 1 further comprising a current source that sets an operating current of the amplifier device.

5. The amplifier device of claim 1 wherein voltage drop across the third transistor in response to an input voltage difference between the non-inverting and inverting inputs provides a first stage of gain.

6. The amplifier device of claim 5 wherein voltage output from the third transistor is fed to the input of the fourth transistor which provides a second stage of gain.

7. The amplifier device of claim 1 further comprising a current source that sets an operating current of the amplifier device.

8. A read-out integrated circuit (ROIC) comprising the amplifier device of claim 1.

9. A sensor system comprising the ROIC of claim 8 wherein the system includes a transducer array operatively coupled to the ROIC by an interconnect.

10. A system-on-chip comprising the sensor system of claim 9.

11. A amplifier device, comprising:
a differential transistor pair for receiving a differential input signal, wherein a first transistor of the differential pair provides a non-inverting input of the amplifier device and a second transistor of the differential pair provides an inverting input of the amplifier device;
an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input and acts as a current source; and
a resistive-capacitive compensation network operatively coupled across the third transistor and to an input of the fourth transistor, wherein the compensation network includes a fifth transistor serially connected to a capacitor, and the fifth transistor is configured to receive a bias voltage on its input so as to function as a resistor.

12. The amplifier device of claim 11 wherein voltage drop across the third transistor in response to an input voltage difference between the non-inverting and inverting inputs provides a first stage of gain.

13. The amplifier device of claim 12 wherein voltage output from the third transistor is fed to the input of the fourth transistor which provides a second stage of gain.

14. The amplifier device of claim 11 further comprising a current source that sets an operating current of the amplifier device.

15. An amplifier device comprising:
a differential transistor pair for receiving a differential input signal, wherein a first transistor of the differential pair provides a non-inverting input of the amplifier device and a second transistor of the differential pair provides an inverting input of the amplifier device;
an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input and acts as a current source; and
an integration capacitor operatively coupled between an output of the amplifier device and the inverting input.

16. An amplifier device comprising:
a differential transistor pair for receiving a differential input signal, wherein a first transistor of the differential pair provides a non-inverting input of the amplifier device and a second transistor of the differential pair provides an inverting input of the amplifier device;
an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input and acts as a current source; and
a reset switch operatively coupled between an output of the amplifier device and the inverting input, wherein the non-inverting input is configured to receive a bias voltage that sets a reset voltage that will be presented at the amplifier device output during a reset interval.

17. The amplifier device of claim 16 wherein voltage drop across the third transistor in response to an input voltage difference between the non-inverting and inverting inputs provides a first stage of gain.

18. The amplifier device of claim 17 wherein voltage output from the third transistor is fed to the input of the fourth transistor which provides a second stage of gain.

19. The amplifier device of claim 16 further comprising a current source that sets an operating current of the amplifier device.

20. An amplifier device, comprising:
a differential transistor pair for receiving a differential input signal, wherein a first transistor of the differential pair provides a non-inverting input of the amplifier device and a second transistor of the differential pair provides an inverting input of the amplifier device;
an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input and acts as a current source;
a resistive-capacitive compensation network operatively coupled across the third transistor and to an input of the fourth transistor; and
a current source that sets an operating current of the amplifier device.

21. The amplifier device of claim 20 wherein voltage drop across the third transistor in response to an input voltage difference between the non-inverting and inverting inputs provides a first stage of gain, and voltage output from the third transistor is fed to the input of the fourth transistor which provides a second stage of gain.

22. The amplifier device of claim 20 wherein the compensation network includes a resistor serially connected to a capacitor.

23. The amplifier device of claim 20 wherein the compensation network includes a fifth transistor serially connected to a capacitor, and the fifth transistor is configured to receive a bias voltage on its input so as to function as a resistor.

24. The amplifier device of claim 20 further comprising:
an integration capacitor operatively coupled between an output of the amplifier device and the inverting input; and
a reset switch coupled across the integration capacitor, wherein the non-inverting input is configured to receive a bias voltage that sets a reset voltage that will be presented at the amplifier device output during a reset interval.

25. A system-on-chip comprising:
a read-out integrated circuit (ROIC) configured with a plurality of the amplifier device of claim 20; and
a transducer array operatively coupled to the ROIC by an interconnect.

26. A sensing system, comprising:
a transducer array; and
a read-out integrated circuit (ROIC) operatively coupled to the transducer array by an interconnect, the ROIC including:
a differential transistor pair for receiving a differential input signal, wherein a first transistor of the differential pair provides a non-inverting input of the amplifier device and a second transistor of the differential pair provides an inverting input of the amplifier device;
an amplification stage operatively coupled to the differential transistor pair, the amplification stage including a third transistor serially connected with the first transistor of the differential pair, and a fourth transistor serially connected with the second transistor of the differential pair, wherein the third transistor is configured to receive a bias voltage on its input and acts as a current source;
a resistive-capacitive compensation network operatively coupled across the third transistor and to an input of the fourth transistor;
a current source that sets an operating current of the amplifier device;
an integration capacitor operatively coupled between an output of the amplifier device and the inverting input; and
a reset switch coupled across the integration capacitor, wherein the non-inverting input is configured to receive a bias voltage that sets a reset voltage that will be presented at the amplifier device output during a reset interval;
wherein voltage drop across the third transistor in response to an input voltage difference between the non-inverting and inverting inputs provides a first stage of gain, and voltage output from the third transistor is fed to the input of the fourth transistor which provides a second stage of gain.

27. The system of claim 26 wherein the transducer array is for sensing radiation.

\* \* \* \* \*